United States Patent
Klee et al.

(10) Patent No.: US 6,999,297 B1
(45) Date of Patent: Feb. 14, 2006

(54) BREAKDOWN-RESISTANT THIN FILM CAPACITOR WITH INTERDIGITATED STRUCTURE

(75) Inventors: Mareike Klee, Hückelhoven (DE); Wilhelm Herrmann, Roetgen (DE); Uwe Mackens, Aachen (DE); Paulus H. M. Keizer, Eindhover (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/483,923

(22) Filed: Jan. 18, 2000

(30) Foreign Application Priority Data

Jan. 20, 1999 (DE) ......................... 199 02 029

(51) Int. Cl.
  *H01G 4/005* (2006.01)

(52) U.S. Cl. ..................................... 361/303; 361/306.3
(58) Field of Classification Search ................. 361/303, 361/304, 306.1, 306.3, 309, 311–313, 321.2–321.5
  See application file for complete search history.

(56) References Cited

U.S. PATENT DOCUMENTS

| | | | | |
|---|---|---|---|---|
| 3,596,370 A | * | 8/1971 | Gabrail | 361/306.1 |
| 4,410,867 A | * | 10/1983 | Arcidiacono et al. | 333/172 |
| 4,453,199 A | * | 6/1984 | Ritchie et al. | 361/306.1 |
| 5,122,923 A | * | 6/1992 | Matsubara et al. | 361/321.5 |

FOREIGN PATENT DOCUMENTS

JP  07283076 A  10/1995

* cited by examiner

*Primary Examiner*—Anthony Dinkins
(74) *Attorney, Agent, or Firm*—Norman N. Spain

(57) ABSTRACT

The invention relates to a thin film capacitor with a carrier substrate, at least two interdigitated electrodes, and a dielectric. A staggered arrangement of at least one interdigitated electrode below the dielectric with respect to an interdigitated electrode above the dielectric results in a breakdown-resistant thin film capacitor which can be manufactured in the same production process as a standard monolayer capacitor.

4 Claims, 2 Drawing Sheets

BREAKDOWN-RESISTANT THIN FILM CAPACITOR WITH INTERDIGITATED STRUCTURE

BACKGROUND OF THE INVENTION

The invention relates to a thin film capacitor which comprises a carrier substrate, at least two interdigitated electrodes, and at least one dielectric.

Dielectric materials with high dielectric constant values ($\epsilon_r > 50$) are used for achieving high capacitance values in capacitors of small dimensions. Dielectrics with $\epsilon_r > 50$ at dielectric thicknesses of 50 nm to 2 $\mu$m are made by means of thin film processes in the manufacture of of thin film capacitors. An inexpensive method which is used for depositing thin layers with $\epsilon_r > 50$ is a wet chemical thin film method such as, for example, the sol-gel method. The lower electrode in a thin film capacitor is made of a non-noble metal such as, for example, aluminum or copper, or a noble metal, for example silver, a silver alloy, or platinum. For the upper electrode, noble metals such as, for example, platinum, silver, silver alloys, or NiCr/gold are used, as for the lower electrode, or alternatively non-noble metals such as, for example, aluminum, nickel, or copper. These are applied by means of thin film processes such as, for example, sputtering or chemical deposition from the gas phase. The electrodes are structured by means of lithographical processes in combination with wet or dry etching steps. Suitable carrier substrate materials are Si wafers, glass or ceramic materials. A protective layer is used for protecting the capacitor construction, for example an organic layer and/or an inorganic layer provided in a printing process or a thin film process. The capacitors are further provided with current supply contacts, either individually or in rows.

This state of the art technology is quite capable of producing inexpensive thin film capacitors which comply with standard specifications. The layer thicknesses of approximately one micrometer, however, do not suffice if higher operating voltages $U_{rated}$ (50 V, 100 V and higher) are to be accommodated in conjunction with increased life requirements for low capacitance values of a few picofarad in high-frequency applications.

A higher breakdown resistance is found in so-called interdigitated capacitors whose electrodes have a finger-like arrangement. The finger shapes of these interdigitated electrodes and their interlocking arrangement together with the superimposed dielectric form the actual capacitor. The capacitance value of such an arrangement is a function of the finger interspacing, the length of the overlaps, the thickness of the dielectric, the dielectric constant values of the substrate and of the dielectric, and the thickness of the electrodes. The finger interspacing in fact determines the breakdown resistance and the resulting admissible operating voltage of the capacitor type.

A capacitor arrangement with interdigitated electrodes is known from publication no. 07283076 A from "Patent Abstracts of Japan", wherein several interdigitated electrode layers are present one above the other so as to enhance the capacitance value still further. The interdigitated electrodes of a capacitor unit all lie in one plane, and a dielectric is present between every two adjoining electrode levels. A disadvantage of the arrangement of the electrodes in one plane is that the full thickness of the dielectric is not utilized for contributing to the capacitance of the capacitor.

SUMMARY OF THE INVENTION

The invention has for its object to develop an improved thin film capacitor with interdigitated electrodes and a high breakdown resistance.

This object is achieved in a thin film capacitor comprising a carrier substrate, at least two interdigitated electrodes, and at least one dielectric, which is characterized in that at least one interdigitated electrode is arranged below the dielectric and at least one interdigitated electrode is arranged above the dielectric.

The layers of the dielectric contribute to the capacitance behavior of the capacitor when the interdigitated electrodes are positioned above and below the dielectric.

A preferred embodiment provides that the interdigitated electrode above the dielectric is positioned staggered with respect to the interdigitated electrode below the dielectric.

The staggered arrangement achieves that the dielectric is permeated more evenly by the electric field, and accordingly higher capacitance values can be attained, all other parameters remaining the same.

A further preferred embodiment is characterized in that the dielectric comprises a plurality of layers.

It is possible through the use of multiple layers, for example double, triple, or quadruple layers, to compensate for the unfavorable temperature behavior of some dielectric materials and to improve the temperature dependence of the capacitance value of the thin film capacitor.

In a preferred embodiment, the dielectric comprises a ferroelectric ceramic material.

Ferroelectric ceramic materials have a high relative dielectric constant $\epsilon_r$ annnd allow for high capacitance values in small dimensions.

It is furthermore preferred that a barrier layer is provided on the carrier substrate.

Reactions with the dielectric or short-circuits can be avoided by means of a barrier layer in the case of substrates having a rough surface, for example $Al_2O_3$.

DETAILED DESCRIPTION OF THE INVENTION

Figure 1:
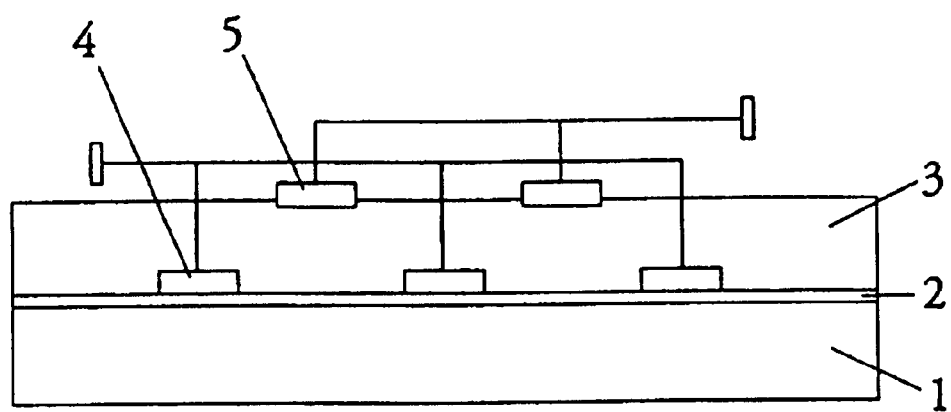
FIG. 1 is a diagram of the construction of a thin film capacitor with two interdigitated electrodes.

In FIG. 1, a thin film capacitor comprises a carrier substrate 1 which is made, for example, from a ceramic material, a glass-ceramic material, a glass material, or silicon. A barrier layer, for example made from $SiO_2$, $TiO_2$, $Al_2O_3$ or $ZrO_2$, is provided on the carrier substrate 1. On this barrier layer 2 there is a first interdigitated electrode 4 which comprises, for example, Al, Al doped with Cu,
Cu,
W,
Pt,
Ni,
Pd,
Pd/Ag,
TiW/Al,
Ti/Pt,
Ti/Ag, Ti/Ag/TiIr,
Ti/Ag$_x$Pt$_{1-x}$ (0≦x≦1)
Ti/Ag/Pt$_x$Al$_{1-x}$ (0≦x≦1),
Ti/Ag$_x$Pt$_{1-x}$/Ir (0≦x≦1),
Ti/Ag/(Ir/IrO$_x$) (0≦x≦2),
Ti/Ag/Ru$_x$Pt$_{1-x}$ (0≦x≦1),
Ti/Pt$_x$Al$_{1-x}$/Ag/Pt$_y$Al$_{1-y}$ (0≦x≦1, 0≦y≦1),
Ti/Ag/Pt$_y$(RhO$_x$)$_{1-y}$ (0≦x≦2, 0≦y≦1),
Ti/Ag/Pt$_x$Rh$_{1-x}$ (0≦x≦1),
Ti/Ag$_x$Pt$_{1-x}$/(Ir/IrO$_y$) (0≦x≦1, 0≦y≦2),
Ti/Ag$_x$Pt$_{1-x}$/Pt$_y$Al$_{1-y}$ (0≦x≦1, 0≦y1),
Ti/Ag/Ti,
Ti/Ni/ITO or
NiCrAl/Ni, Ni$_x$Cr$_y$Al$_z$/Ni (0≦x≦1, 0≦y≦1, 0≦z≦1).

A dielectric 3 having a high relative dielectric constant $\epsilon_r$>20 is provided on the lower interdigitated electrode 4. The dielectric 3 may comprise, for example, Pb(Zr$_x$Ti$_{1-x}$)O$_3$ (0≦x≦1) with and without excess lead, (Pb,Ba)(Mg$_{1/3}$Nb$_{2/3}$)$_x$(Zn$_{1/3}$Nb$_{2/3}$)$_y$Ti$_z$O$_3$ (0≦x≦1, 0≦y≦1, 0≦z≦1),
Ba$_{1-x}$Sr$_x$TiO$_3$ (0≦x≦1),
Pb$_{1-1.5y}$La$_y$(Zr$_x$Ti$_{1-x}$)O$_3$ (0≦x≦1, 0≦y≦0.2),
SrTi$_{1-x}$Zr$_x$O$_3$ (0≦x≦1),
(Zr,Sn)TiO$_4$,
Ta$_2$O$_5$ with Al$_2$O$_3$ dopants,
Pb$_{1-\alpha y}$La$_y$TiO$_3$ (0≦y≦0.3, 1.3≦x≦1.5),
(Pb,Ca)TiO$_3$,
BaTiO$_3$ with and without dopants,
Ba$_2$Ti$_9$O$_{20}$,
CaSm$_2$Ti$_5$O$_{14}$,
TiZr$_{0.8}$Sn$_{0.2}$O$_4$,
Ba$_2$Ti$_{8.53}$Zr$_{0.50}$Mn$_{0.01}$O$_{20}$,
SrZr$_x$Ti$_{1-x}$O$_3$ (0≦x≦1) with and without Mn dopants,
BaZr$_x$Ti$_{1-x}$O$_3$ (0≦x≦1),
Ba$_{1-y}$Sr$_y$Zr$_x$Ti$_{1-x}$O$_3$ (0≦x≦1, 0≦y≦1),
SrTiO$_3$ doped with, for example, La, Nb, Fe or Mn,
(BaTiO$_3$)$_{0.18-0.27}$+(Nd$_2$O$_3$)$_{0.316-0.355}$+(TiO$_2$)$_{0.276-0.355}$+(Bi$_2$O$_3$)$_{0.025-0.081}$+x ZnO,
CaZrO$_3$,
CaTiO$_3$+CaTiSiO$_5$,
(Sr,Ca)(TiZr)O$_3$,
(Sr,Ca,M)(Ti,Zr)O$_3$ (M=Mg or Zn),
(Sr,Ca,Cu,Mn,Pb)TiO$_3$+Bi$_2$O$_3$,
BaO—TiO$_2$—Nd$_2$O$_3$—Nb$_2$O$_5$,
(Ba,Ca)TiO$_3$+Nb$_2$O$_5$, Co$_2$O$_3$, MnO$_2$,
TiO$_2$,
BaO—PbO—Nd$_2$O$_3$—TiO$_2$,
Ba(Zn,Ta)O$_3$,
BaZrO$_3$,
Nd$_2$T$_2$O$_7$,
PbNb$_x$(Zr$_{0.6}$Sn$_{0.4}$)$_{1-y}$Ti$_y$))$_{1-x}$O$_3$ (0≦x≦0.9, 0≦y≦1),
Pb(Mg$_{1/3}$Nb$_{2/3}$)O$_3$]$_x$—[PbTiO$_3$]$_{1-x}$ (0≦x≦1),
(Pb,Ba,Sr)(Mg$_{1/3}$Nb$_{2/3}$)$_x$Ti$_y$(Zn$_{1/3}$Nb$_{2/3}$)$_{1-x-y}$O$_3$ (0≦x≦1, 0≦y≦1), x+y≦1)
a) Pb(Mg$_{1/2}$W$_{1/2}$)O$_3$
b) Pb(Fe$_{1/2}$Nb$_{1/2}$)O$_3$
c) Pb(Fe$_{2/3}$W$_{1/3}$)O$_3$
d) Pb(Ni$_{1/3}$Nb$_{2/3}$)O$_3$
e) Pb(Zn$_{1/3}$Nb$_{2/3}$)O$_3$
f) Pb(Sc$_{1/2}$Ta$_{1/2}$)O$_3$ as well as combinations of the compounds a) to f) with PbTiO$_3$ and Pb(Mg$_{1/3}$Nb$_{2/3}$)O$_3$. An upper interdigitated electrode 5 is provided on the dielectric 3, which electrode comprises, for example, Al, Al doped with Cu,
cu,
W,
Pt,
Ni,
Pd,
Pd/Ag,
TiW/Al,
Ti/Pt,
Ti/Ag,
Ti/Ag/TiIr,
Ti/Ag$_x$Pt$_{1-x}$ (0≦x≦1),
Ti/Ag/Pt$_x$Al$_{1-x}$ (0≦x≦1),
Ti/Ag$_x$Pt$_{1-x}$/Ir (0≦x≦1),
Ti/Ag/(Ir/IrO$_x$) (0≦x≦2),
Ti/Ag/Ru$_x$Pt$_{1-x}$ (0≦x≦1),
Ti/Pt$_x$Al$_{1-x}$/Ag/Pt$_y$Al$_{1-y}$ (0≦x≦1, 0≦y≦1),
Ti/Ag/Pt$_y$(RhO$_x$)$_{1-y}$ (0≦x≦2, 0≦y≦1),
Ti/Ag/Pt$_x$Rh$_{1-x}$ (0≦x≦1),
Ti/Ag$_x$Pt$_{1-x}$/(Ir/IrO$_y$) (0≦x≦1, 0≦y≦2),
Ti/Ag$_x$Pt$_{1-x}$/Pt$_y$Al$_{1-y}$ (0≦x≦1, 0≦y≦1),
Ti/Ag/Ti,
Ti/Ni/ITO or
Ni$_x$Cr$_y$Al$_z$/Ni (0≦x≦1, 0≦y≦1, 0≦z≦1)

Alternatively, the dielectric 3 may comprise multiple layers, for example double, triple, or quadruple layers.

In addition, a multiple layer structure may be implemented with three or more interdigitated electrodes in staggered arrangement.

Figure 2:
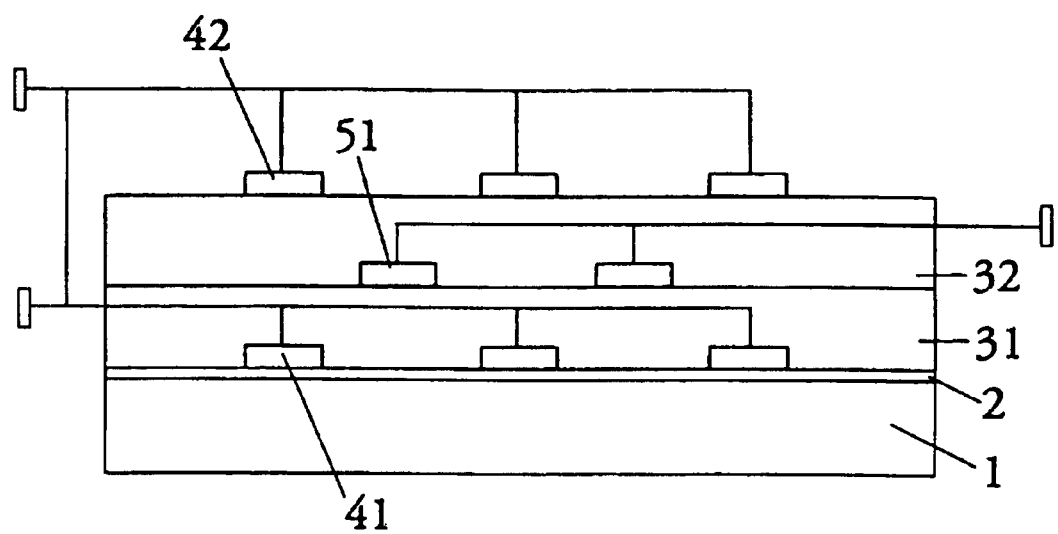
FIG. 2 is a diagram of the construction of a thin film capacitor with three interdigitated electrodes.

FIG. 2 shows such a multiple layer arrangement with three staggered interdigitated electrodes 41, 42, and 51, and two dielectrics 31 and 32. In this embodiment of the thin film capacitor according to the invention, a first dielectric 31 is disposed over a first interdigitated electrode 41, over this a second interdigitated electrode 51 covered by a second dielectric layer 32, and a third interdigitated electrode 42. The first interdigitated electrode 41 and the third interdigitated electrode 42 are connected in parallel.

Embodiments of the invention which represent examples of how the invention may be realized in practice will now be explained in detail below.

Embodiment 1:

A carrier substrate 1 of glass is provided with a barrier layer 2 of TiO$_2$. A lower interdigitated electrode 4 of Ti/Pt is provided on this barrier layer 2. A dielectric 3 of BaTiO$_3$ is disposed over the lower interdigitated electrode 4. An upper interdigitated electrode 5 of Pt is provided on said dielectric 3.

Embodiment 2:

A carrier substrate 1 of glass is provided with a barrier layer 2 of TiO$_2$. A lower interdigitated electrode 4 of Ti/Pt is provided on this barrier layer 2. A dielectric 3 of Pb(Zr$_{0.53}$T$_{0.47}$)O$_3$ doped with lanthanum is disposed over the lower interdigitated electrode 4. An upper interdigitated electrode 5 of Pt is provided on said dielectric 3.

Standard monolayer capacitors are also manufactured in the same manufacturing process. The results of three tests are summarized in Table 1 below.

TABLE 1

Standard Monolayer Capacitor with 20 V/μm and 13 nF/mm²

|  | Test 1 | Test 2 | Test 3 | Average |
|---|---|---|---|---|
| Rel. Dielectric Constant $\epsilon_r$ | 1120 | 1060 | 1070 | 1083 |
| Dielectric [μm] | 0.754 | 0.784 | 0.702 | 0.747 |
| Op. Voltage $U_{rated}$ [V] |  |  |  | 15 |

TABLE 2

Parameters for the interdigitated electrodes

| Number of Fingers: | 12 |
|---|---|
| Number of Gaps: | 11 |
| Length of Finger Overlap [μm]: | 850 |
| Total Overlap Length [μm]: | 9350 |

Table 3 shows the average capacitance values C and the operating voltages $U_{rated}$ for thin film capacitors with interdigitated electrodes (parameters in accordance with Table 2) and a lanthanum-doped PZT dielectric (layer thicknesses in accordance with Table 1).

TABLE 3

Average Capacitance Values C of Thin Film Capacitors with Interdigitated Electrodes and Lanthanum-Doped PZT Dielectric Layers.

| Finger Interspacing [μm] | Capacitance C [pF] | Op. Voltage $U_{rated}$ [V] |
|---|---|---|
| 10 | 6.3 | 200 |
| 5 | 10.8 | 100 |
| 3 | 17.5 | 60 |

What is claimed is:

1. A thin film capacitor comprising a carrier substrate (1), at least two interdigitated electrodes (4, 5), and at least one dielectric (3), characterized in that at least one interdigitated electrode (4) is arranged below the dielectric (3), at least one interdigitated electrode (5) is arranged above the dielectric (3) and the interdigitated electrode (5) above the dielectric (3) is positioned in a staggered, non-overlapping, arrangement with respect to the interdigitated electrode (4) below the dielectric (3).

2. A thin film capacitor as claimed in claim 1, characterized in that the dielectric (3) comprises a plurality of layers.

3. A thin film capacitor as claimed in claim 1, characterized in that the dielectric (3) comprises a ferroelectric ceramic material.

4. A thin film capacitor as claimed in claim 1, characterized in that a barrier layer (2) is provided on the carrier substrate (1).

* * * * *